| United States Patent [19] | [11] Patent Number: 4,601,944 |
|---|---|
| Zussman | [45] Date of Patent: Jul. 22, 1986 |

[54] POLYBUTADIENE-EPOXY-ANHYDRIDE LAMINATING RESINS

[75] Inventor: Melvin P. Zussman, Wilkinsburg, Pa.

[73] Assignee: Westinghouse Electric Corp., Pittsburgh, Pa.

[21] Appl. No.: 741,414

[22] Filed: Jun. 5, 1985

[51] Int. Cl.⁴ .................. C08G 59/24; C08G 59/42
[52] U.S. Cl. ........................... 428/251; 156/330; 428/252; 428/901; 525/114; 525/122; 528/297; 528/361
[58] Field of Search ............... 525/114, 122; 528/361, 528/297; 428/251, 252, 901; 156/307.1, 330

[56] References Cited

U.S. PATENT DOCUMENTS

| 3,113,036 | 12/1963 | Schwarzer | 525/114 X |
|---|---|---|---|
| 3,635,860 | 1/1972 | Salensky | 525/114 X |
| 3,671,477 | 6/1972 | Nesbitt | 525/114 X |
| 3,686,359 | 8/1972 | Soldatos et al. | 525/122 |
| 3,759,777 | 9/1973 | Lubowitz et al. | 156/330 |
| 4,028,432 | 6/1977 | Dawans et al. | 260/836 |
| 4,216,297 | 8/1980 | Vaughan et al. | 525/334 |
| 4,532,299 | 7/1985 | Seneker | 525/122 |

OTHER PUBLICATIONS

Sawatari et al., Chemical Abstracts, 90, 153203b (1979).
Hosaka et al., Chemical Abstracts, 87, 185518n (1977).

Primary Examiner—Earl Nielsen
Attorney, Agent, or Firm—R. D. Fuerle

[57] ABSTRACT

Disclosed is a composition that includes a liquid prepolymer that is the reaction product of a monoanhydride, a cycloaliphatic epoxy, and an alcohol. Also included in the composition is a maleated polybutadiene that is a reaction product of butadiene, maleic anhydride, and an oxygen scavenger. The composition also includes a tertiary amine accelerator, a free-radical initiator, and a solvent. A prepreg is prepared from the composition by immersing a porous substrate into the composition, drying and curing to the B-stage. A laminate is prepared by forming a stack of prepregs and heating under pressure to the C-stage.

23 Claims, 1 Drawing Figure

U.S. Patent  Jul. 22, 1986  4,601,944
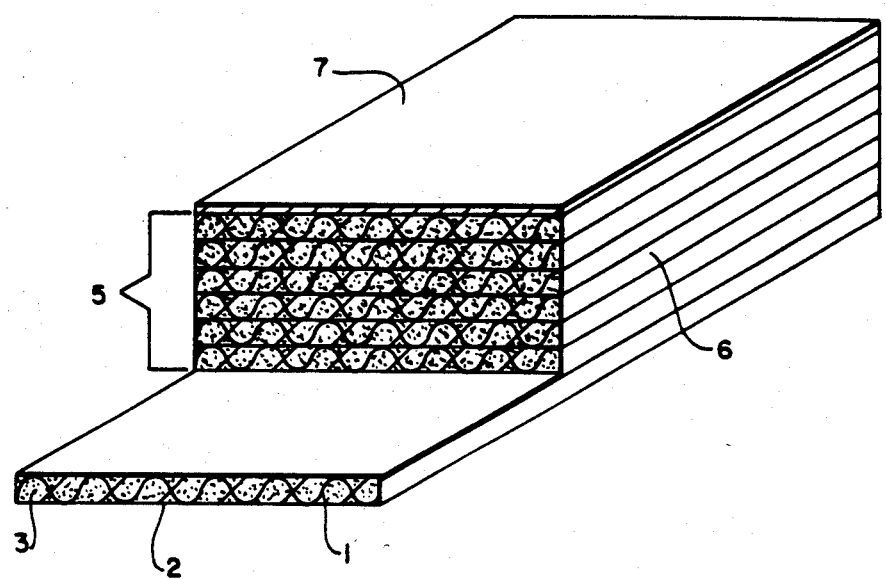

POLYBUTADIENE-EPOXY-ANHYDRIDE LAMINATING RESINS

The Government of the United States of America has rights in this invention pursuant to Contract No. F33615-82-C-5047 awarded by the U.S. Department of Defense.

BACKGROUND OF THE INVENTION

The production of multilayer printed wiring boards (PWB's) for very high speed integrated circuitry requires laminates that fulfill several requirements. Among these are a low dielectric constant, preferably less than 3.0, low dielectric loss, minimal water absorption, a coefficient of thermal expansion compatible with that of surface mounted devices, and, preferably, processing conditions similar to those used in conventional laminate manufacture. Also important is a high glass transition temperature (Tg), preferably above 185° C., because a high glass transition temperature insures good dimensional stability during use, especially at higher temperatures, so that the laminate does not warp. Also, many properties such as dielectric constant, dissipation factor, and coefficient thermal expansion are adversely affected at the glass transition temperature, so the higher the glass transition temperature is the better. The epoxy resins that are used in conventional PWB's are unsatisfactory because their dielectric constants and losses are too high, and their glass transition temperatures are too low.

High vinyl (i.e., having a high percentage of 1,2-unsaturation) polybutadienes (PBD) are attractive resins for use in circuit board laminates since they exhibit a dielectric constant less than 2.5, a dielectric loss tangent below $10^{-4}$, and have a large amount of pendant unsaturation available for crosslinking. A further benefit is that low molecular weight, low viscosity PBD resins are commercially available, permitting formulations high in nonvolatile content. Polybutadiene does, however, show several deficiencies as a laminating resin, most of which are associated with its cure behavior. The Tg of cross-linked polybutadiene is highly dependent on processing conditions; high Tg's near 200° C. are achieved only by a slow, stepwise cure which is incompatible with commercial B-staging and press curing practices. Additionally, when prepregs made from polybutadiene resins that contain peroxide free-radical initiators are B-staged in the presence of oxygen, they undergo surface oxidation in preference to chain reaction of the pendant vinyl groups. Finally, because of the chain growth cure mechanism and the extremely tacky nature of uncrosslinked PBD, non-tacky prepregs that will flow during press cure are generally not attainable.

A number of modified resin systems have been examined with an aim to reducing these limitations. The use of styrene block copolymers improves the B-stage behavior but limits the Tg. Co-curing PBD with a number of acrylates or polyunsaturated monomers (e.g., triallyl cynaurate) results in improved processing but lowers the Tg and raises the dielectric constant. The incorporation of bismaleimides into polybutadiene resins has been described, but, in general, bismaleimides are not compatible with polybutadiene, and the cured laminates reflects two-phase behavior by displaying separate mechanical relaxation transitions for each phase. Alloys of polybutadiene with bismaleimide-triazine prepolymers yield high Tg laminates. However, the dielectric constant is 3.2 or greater for a quartz based laminate and phase separation occurs at all but a relatively narrow range of resin compositions.

SUMMARY OF THE INVENTION

I have discovered that by pre-reacting a monoanhydride with a cycloaliphatic epoxy to form a liquid prepolymer, I am able to form a laminating resin which includes a maleated polybutadiene from which laminates having excellent properties can be made. I have obtained Tg's near or even slightly above 185° C., and dielectric constants of 3.0 or less in quartz supported laminates made using the laminating resins of this invention. The polybutadiene used in the resin compositions of this invention undergoes little, if any, oxidation during B-staging, and during press cure the polybutadiene is able to flow and cure. The laminates can be prepared using conventional manufacturing procedures.

DESCRIPTION OF THE INVENTION

The accompanying drawing is an isometric view in section showing a certain presently preferred embodiment of a prepreg and a laminate according to this invention.

In the drawing, a prepreg 1 consists of a porous substrate 2 impregnated with an organic resin 3 which has been dried and cured to the B-stage. A laminate 5 consists of a stack of numerous plies 6 of said prepregs, cured under heat and pressure to the C-stage. A sheet of copper foil 7 has been bonded to one surface.

The laminating resin compositions of this invention include a liquid prepolymer, a maleated polybutadiene, a hindered base accelerator, a free radical initiator, and a solvent. In the first step of the process of preparing the laminating resin compositions of this invention, a monoanhydride and a cycloaliphatic epoxy are pre-reacted to form the liquid prepolymer.

The epoxy resin used in forming the prepolymer must be a cycloaliphatic epoxy because a low dielectric constant and a high glass transition temperature in the laminate cannot be achieved with other types of epoxy resins. This is somewhat surprising because aromatic compounds are generally known to have better insulating and thermal properties than aliphatic compounds. A cycloaliphatic epoxy resin consists of a saturated carbon ring having an epoxy oxygen bonded to two vicinal ring carbon atoms. The cycloaliphatic epoxy may be a monoepoxide, or a mixture of monoepoxide and diepoxide, but it is preferably 100% diepoxide, where both epoxy oxygens are bonded to vicinal ring carbon atoms, because the presence of monoepoxide makes the resulting laminate too elastomeric. Suitable aliphatic epoxies include vinyl cyclohexane diepoxide, limonene diepoxide, (3,4-epoxy-cyclohexylmethyl)-3,4-epoxy-cyclohexane carboxylate, dicyclopentadiene diepoxide, glycidyl-2,3-epoxy cyclopentylether, tris(cyclopentenyl)ether diepoxide, and 2,3-epoxy cyclopentyl-9,10-epoxy stearate. The preferred cycloaliphatic epoxy is (3,4-epoxy-cyclohexylmethyl)-3,4-epoxy-cyclohexane carboxylate because it is commercially available; it has the general formula:

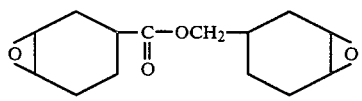

The anhydride used in preparing the liquid prepolymer used in the compositions of this invention may be aromatic or aliphatic but it is preferably aliphatic as aliphatic anhydrides are more soluble. The anhydride may be saturated or unsaturated, but saturated anhydrides are preferred because they result in a higher glass transition temperature. The anhydride must be a monoanhydride (i.e., have only one anhydride group) because di- or poly-anhydrides crosslink too rapidly and may gel the composition too soon. Dicarboxylic acids cannot be used instead of monoanhydrides because they evolve water during cure. Suitable monoanhydrides include hexahydrophthalic anhydride, 1-methylhexahydrophthalic anhydride, tetrahydrophthalic anhydride, 1-methyltetrahydrophthalic anhydride, phthalic anhydride, nadic anhydride, and nadic methyl anhydride. The preferred monoanhydride is hexahydrophthalic anhydride because it results in a laminate having the highest glass transition temperature.

The prepolymer is prepared by reacting the monoanhydride with the cycloaliphatic epoxy in the presence of an alcohol. The amount of monoanhydride and cycloaliphatic epoxy are selected so that the number of epoxide rings is about 0 to about 20 mole percent in excess of what is stoichiometrically required to react with the monoanhydride, and preferably about 5 to about 12 mole percent in excess of stoichiometric. If fewer excess epoxide rings are present, the epoxide functionality is used up in reactions between epoxide rings, and insufficient epoxide rings are left to react with the maleated polybutadiene; as a result, the glass transition temperature will be low. If more than 20 mole percent excess epoxide rings are present, the excess epoxide rings will again react with other epoxide rings, forming a polyether which will also lower the glass transition temperature.

The alcohol acts as an initiator in the preparation of the prepolymer. While any alcohol may be used, difunctional alcohols are preferred. Suitable alcohols include methyl alcohol, ethyl alcohol, glycerol, trimethylol propane, erythritol, pentaerythritol, and propylene glycol. Propylene glycol is preferred because it is readily available and inexpensive. About 0.1 to 1 wt.% of the alcohol, based on the weight of the monoanhydride plus the cycloaliphatic epoxy, is suitable.

The prepolymer can be made by heating the monoanhydride, the cycloaliphatic epoxy, and the alcohol in the absence of a solvent until a viscosity of about 400 centipoises at 95° C. is reached. The reactants are then diluted with a solvent to about 70% solids and the solution is heated to about 200 centipoises at about 92° C. Suitable solvents include aromatic hydrocarbons such as toluene, xylene, and benzene, and aliphatic ketones such as methylisobutyl ketone (MIBK) and methylethyl ketone.

While I do not wish to be bound by any theories, I believe that in the preparation of the prepolymer the epoxide groups on the cycloaliphatic epoxy and the anhydride group on the monoanhydride react as follows:

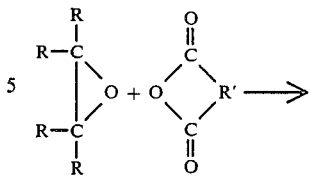

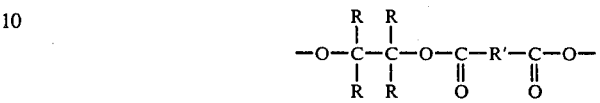

The maleated polybutadiene used in resin compositions of this invention is a commercially available product, but it can also be prepared by the reaction of polybutadiene with maleic anhydride. The polybutadiene used in preparing the maleated polybutadiene should have a molecular weight of about 1000 to about 5000. If the molecular weight is less than 1000 it is difficult to form a non-tacky prepreg, and the polybutadiene may not flow in the press when the laminate is prepared. If the molecular weight is greater than 5000 it is difficult to dissolve the polybutadiene in a solvent. A preferred molecular weight range is about 3000 to about 4000. The polybutadiene should have a high percentage of 1,2-unsaturation in order to obtain a high glass transition temperature and good curing properties. The 1,2-unsaturation content should be at least of about 80%, and it is preferably at least about 90%. In preparing the maleated polybutadiene, about 0.05 to about 0.2 moles, and preferably about 0.1 to 0.15 moles, of maleic anhydride are reacted per repeat unit in the polybutadiene. If less maleic anhydride is used poor molecular mixing between the prepolymer and the maleated polybutadiene may occur, which could result in the formation of two phases and a low glass transition temperature. If more maleic anhydride is used it is difficult for the polybutadiene to react with all the maleic anhydride, and the free maleic anhydride can increase the dielectric constant of the resulting laminate.

In the reaction of the maleic anhydride with the polybutadiene, it is desirable to use about 0.01 to about 1.0 percent by weight (based on total solids weight of maleic anhydride plus polybutadiene) of an oxygen scavenger. Preferably, about 0.3 to about 0.6 weight percent of the oxygen scavenger is used. Suitable oxygen scavengers are well known in the art and include 2,6-diaminoanthraquinone, 1-aminoanthraquinone, and bis(t-butyl)hydroxytoluene (BHT). The preferred oxygen scavenger is 2,6-diaminoanthraquinone because it is readily soluble in the reaction mixture. The presence of an oxygen scavenger is desirable because oxygen in the resin composition can form peroxides, which can result in the polymerization of the double bonds that are present and gel the composition.

The reaction of the maleic anhydride with the polybutadiene proceeds in the absence of a solvent by heating to about 160° to about 190° C. for about 3 to about 6 hours. The reaction is complete when the reaction mixture turns a clear dark brown color and its viscosity increases. While the exact structure of maleated polybutadiene has not been determined, and I do not wish to be bound by any theories, it is believed that it has one of the following structures or is a mixture of the following structures:

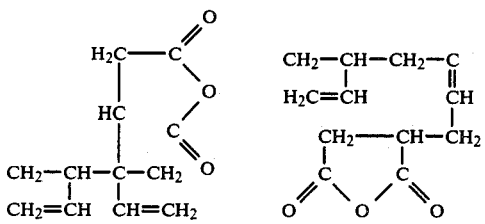

The weight ratio of maleated polybutadiene to prepolymer should be about 2 to 1 to about 1 to 2 as too much prepolymer increases the dielectric constant of the laminate and too much maleated polybutadiene lowers the glass transition temperature; a preferred weight ratio of maleated polybutadiene to prepolymer is about 0.8 to 1 to about 1.2 to 1.

The resin composition of this invention also includes a hindered base accelerator for the epoxy-anhydride reaction. The hindered base accelerator is a tertiary amine such as benzyldimethyl amine, dimethylaniline, N-methylmorpholine, and triethylamine. Benzyldimethyl amine is preferred because it is non-volatile at about 160° C. The amount of tertiary amine should be about 0.1 to 3 percent by weight, and preferably about 0.25 to about 0.75 percent by weight, based on total solids, as less tertiary amine results in an excessively long time to B-stage the resin, and more tertiary amine results in too rapid a cure and a poor flow of the resin.

The resin composition of this invention also includes a free radical initiator to catalyze the additional polymerization of the double bonds, which occurs mostly in the C-stage preparation of the laminate. The free radical initiator should have a half life of at least 30 minutes at 135° C. Peroxides are the preferred free radical initiators as suitable peroxides are commercially available. Examples of suitable peroxides include dicumyl peroxide, bis(t-butylperoxy)diisopropylbenzene, sold by Hercules, Inc. under the trade designation "Vul-CupR," and 2,5-dimethyl, 2,5-di(t-butylperoxy)hexane, sold by Pennwalt, Inc. under the trade designation "Lupersol 101." The amount of free radical initiator should be about 1 to about 6% as less free radical initiator may result in a low glass transition temperature and more is unnecessary. The preferred free radical initiator is a mixture of about 1 to about 2% bis(t-butylperoxy)diisopropylbenzene and about 1 to about 2% 2,5-dimethyl, 2,5-di(t-butylperoxy)hexane because these compounds dissociate at high temperatures.

The resin composition also includes sufficient solvent to form a solution of about 40 to about 70% solids, and preferably about 50 to about 65% solids. If less solid content is present poor build is obtained on the porous substrate, and if more solids are present the viscosity of the resin composition may be too high for easy processing. Suitable solvents include aromatic hydrocarbons such as toluene, xylene, and benzene, and aliphatic ketones such as methylisobutyl ketone and methylethyl ketone.

A prepreg is prepared from the resin composition by impregnating a porous substrate with the composition. Almost any porous material can be used for the substrate including glass, quartz, poly(p-phenylene terephthalamide) ("Kevlar"), and paper. Woven quartz and "Kevlar" cloth are preferred as they have a low dielectric constant. The prepreg is made by immersing the substrate in the resin composition, removing excess resin composition, then heating to evaporate the solvent and to B-stage the resin. This is typically accomplished in a forced air oven at about 125° to 160° C. for about 3 to about 10 minutes, and preferably at about 130° to 140° C. for about 3 to 6 minutes.

A laminate is prepared by forming a stack of prepregs and heating them under pressure. Typical conditions are about 180° to 220° C. for about 40 minutes to about 2 hours under about 500 to about 1500 psi, although conditions can vary with the particular compounds selected. Two or more prepregs are used to form the stack and copper sheets can be bonded to the outer surfaces of the laminates if the laminates are to be used as printed wiring boards. Both single layer and double sided printed wiring boards can be made from the laminates of this invention. Multi-layer printed wiring boards can also be made by bonding a copper sheet to a laminate and applying additional plies of prepregs over the copper sheet, laminating and bonding additional copper sheets on top. The laminates are particularly suitable for use with hermetic chip carriers or as other types of surface mounted devices. The laminates can also be used as structural composites.

The following examples further illustrate this invention.

EXAMPLE 1

A reaction mixture was prepared of 300 grams of polybutadiene having a 1,2-unsaturation content of 90%, and a molecular weight of 3000 sold by Colorado Chemical Company under the trade designation "RICON 154," 2.5 ml toluene, 0.3 grams of 2,6-diamino anthraquinone, and 60 grams of maleic anhydride. The reaction mixture was heated at 170° C. until the mixture became highly viscous and had a homogeneous dark brown color. The resulting 15 mole percent maleated polybutadiene was diluted to 50 wt.% solids with toluene. This mixture is designated "MAPBD."

A reaction mixture was prepared of 55 wt.% cycloaliphatic anhydride sold by Ciba Geigy under the trade designation "CY-179," 44.5% hexahydrophthalic anhydride (HHPA), and 0.5% propylene glycol. The mixture was heated for 10 hours at 85° to 95° C. to yield a viscous, pale yellow liquid prepolymer which was cut to 85% solids with toluene. Similar prepolymers were made using methyltetrahydrophthalic anhydride (ZZLA), methyl nadic anhydride (NMA) and 75 mole% hexahydrophthalic anhydride and 25 mole% tetrahydrophthalic anhydride (HT).

Varnishes were prepared by stirring together toluene solutions of polybutadiene or maleated polybutadiene with the liquid prepolymers. An accelerator of 0.5 wt.% benzyldimethylamine (BDMA) and a free radical initiator of 1.5 wt.% "Lupersol 101" and 1.5 wt.% of "Vulcup R" were added to the solutions. Typically, the varnishes were 50 to 60% solids by weight. The varnishes were dip coated on glass or quartz woven fabric and were B-staged in a forced air oven at about 130° to 135° C. for about 5 to about 6 minutes. The resulting B-staged prepregs were either slightly tacky or non-tacky. The prepregs were cut to form multi-ply stacks and were press laminated at 1000 psi for one hour at 200° C. The following table gives the resin compositions, the B-stage procedure and some of the properties of the laminates.

| Laminate | Resin Composition PBD Resin | % PBD | Anhydride Used | B-Stage Conditions °C. | Min. | Tg (°C.) | ε' | tan δ (%) |
|---|---|---|---|---|---|---|---|---|
| A | "Ricon 159"* | 100 | — | 100 | 90 | 11 | 3.1–3.9 | 0.1–0.5 |
| B | "Ricon 154" | 50 | HHPA | 145 | 5 | 75 | | |
| C | MAPBD | 35 | HHPA | 145 | 5 | 180 | | |
| D | 50 wt % "BN1015"** + 50 wt % MAPBD | 40 | HT | 140 | 5 | 176 | 3.0–2.6 | 0.3–0.9 |
| E | MAPBD | 40 | ZZLA | 160 | 7 | 142 | 3.1 | 0.6 |
| F | MAPBD | 50 | HT | 140 | 5 | 184 | | |
| G | MAPBD | 50 | NMA | 135 | 5.5 | 45 | — | — |
| H | MAPBD | 90 | ZZLA | 150 | 10 | 48 | 2.9 | 0.3 |
| I | "BN1015" | 25 | ZZLA | 140 | 5 | 128 | — | — |
| J | MAPBD | 50 | HHPA | 130 | 5 | 205 | — | — |

*A high vinyl polybutadiene of molecular weight 16,000–22,000 sold by Colorado Chemical.
**A maleated polybutadiene made from polybutadiene having a molecular weight of 1000, sold by Nippon Soda.
Laminates B, C, F, G, I, and J were glass based, and laminates A, D, E, and H were quartz based.

The above table shows that the addition of the prepolymer raises the glass transition temperature of polybutadiene laminates from about 11° C. up to about 180° C. The extent to which the glass transition temperature is raised depends strongly on the identity of the anhydride crosslinker. The table shows that hexahydrophthalic anhydride and mixtures of hexahydrophthalic anhydride with tetrahydrophthalic anhydride raised $T_g$ more than ZZLA and much more than NMA. The extent to which $T_g$ is raised also depends on whether or not the polybutadiene is maleated and on the concentration of initiators used in the varnish. (A low $T_g$ in laminate H is attributed to the absence of benzyldimethyl amine in the formulation.) Less substantial variations were observed in the dielectric properties, and these depended primarily on the ratio of polybutadiene to prepolymer and on the volume fraction of the quartz matrix. Flow during C-stage depended on the concentration of BDMA, the molecular weight of the polybutadiene resin, the identify of the anhydride (NMA increased the flow) and, of course, the time and temperature of the B-stage. The table shows that laminates prepared from the resin formulations of this invention exhibit glass transition temperatures, dielectric properties, and processing behavior which indicates their suitability for very high speed integrated circuitry.

EXAMPLE 2

Two additional formulations were prepared as in Example 1. The following table gives the compositions of these formulations:

| | Composition K | Composition L |
|---|---|---|
| MAPBD pbw* | 50 | 50 |
| 51 wt % "CY-179" + 49 wt % HHPA pbw | 50 | |
| 50 wt % "CY-179" + 50 wt % HT pbw | 1.5 | 50 |
| Lupersol 101, pbw | 1.5 | 1.5 |
| "Vul-Cup R," pbw | 1.5 | 1.5 |
| BDMA, pbw | 0.5 | 0.5 |
| % Solids in Toluene | 55.5 | 55.5 |

*parts by weight

Prepregs and laminates were prepared from these compositions as in Example 1. The following table is the result of tests performed on these laminates.

| | | |
|---|---|---|
| $T_g$ (DSC, °C.) | 192 | 181 |
| ε' | | |
| 1 MHz | 3.11 | |
| 10 MHz | 2.78 | 2.98 |
| 100 MHz | 2.76 | 2.93 |
| 500 MHz | 2.71 | 2.83 |
| Dissipation Factor (%) | | |
| 1 MHz | 0.37 | |
| 10 MHz | 0.41 | 0.81 |
| 100 MHz | 1.3 | |
| 500 MHz | 3.5 | |
| CTE* (X-Y Plane, ppm/°C.) | 8.6 | 8.0 |
| Z Axis Expansion (0–175° C., %) | 0.65 | 0.62 |
| Water Absorption - 30 days (%) | 1.0 | 0.66 |
| Copper Peel Strength (lbs/in.) | 2.4 | 3.7 |
| Weight % Resin | 40 | 34 |
| Volume % Resin | 65 | 60 |

*Coefficient of thermal expansion

The above table shows that these two compositions have properties superior to all the other compositions prepared in Example 1.

I claim:
1. A composition comprising:
   (A) a liquid prepolymer that comprises the reaction product of
      (1) a monoanhydride;
      (2) a cycloaliphatic epoxy in an amount from about stoichiometric with said monoanhydride to about 20 mole % in excess of stoichiometric; and
      (3) about 0.1 to about 1% by weight, based on said monoanhydride weight plus said cycloaliphatic epoxy weight, of an alcohol;
   (B) maleated polybutadiene in a weight ratio with said liquid prepolymer of about 2 to 1 to about 1 to 2, said maleated polybutadiene comprising the reaction product of
      (1) polybutadiene having a molecular weight of about 1000 to about 5000, and having at least 80% 1,2-unsaturation;
      (2) about 0.05 to about 0.2 moles of maleic anhydride per repeating unit of said polybutadiene; and
      (3) about 0.01 to about 1.0% by weight, based on said maleated polybutadiene weight, of an oxygen scavenger; and
   (C) about 0.1 to about 3% by weight, based on total resin solids, of a tertiary amine accelerator;
   (D) about 1 to about 6% by weight, based on total resin solids, of a free radical initiator that has a half life of at least 30 minutes at 135° C.; and
   (E) about 30 to about 60% by weight of a solvent, based on total composition weight.

2. A composition according to claim 1 wherein said monoanhydride is saturated and aliphatic.

3. A composition according to claim 2 wherein said monoanhydride is hexahydrophthalic anhydride.

4. A composition according to claim 1 wherein said epoxy resin is a diepoxide.

5. A composition according to claim 4 wherein said epoxy resin is (3,4-epoxy-cyclohexylmethyl)-3,4-epoxy cyclohexane carboxylate.

6. A composition according to claim 1 wherein said alcohol is propylene glycol.

7. A composition according to claim 1 wherein said tertiary amine is benzyldimethylamine.

8. A composition according to claim 1 wherein said free radical initiator is a mixture of about 0.5 to about 3% by weight, based on total solids, of bis(t-butylperoxy)diisopropyl benzene, and about 0.5 to about 3% by weight, based on total solids, of 2,5-dimethyl2,5-di(t-butylperoxy)hexane.

9. A composition according to claim 1 wherein said solvent is selected from the group consisting of aromatic hydrocarbons, aliphatic ketones, and mixtures thereof.

10. A prepreg comprising a sheet of a porous material impregnated with a composition according to claim 1, dried and cured to the B-stage.

11. A prepreg according to claim 10 wherein said porous material is a woven fabric selected from the group consisting of quartz, poly(p-phenylene terephthalamide), and mixtures thereof.

12. A laminate comprising a stack of prepregs according to claim 10, heated under pressure to the C-stage.

13. A laminate according to claim 12 wherein a copper foil is bonded to at least one surface of said laminate.

14. A multilayer printed wiring board comprising a stack of prepregs according to claim 10, said stack including at least two sheets of copper foil, bonded into a solid mass.

15. A composition comprising:
(A) a liquid prepolymer that comprises the reaction product of
   (1) an aliphatic, saturated monoanhydride;
   (2) a cycloaliphatic diepoxide in an amount from about 5 to about 12 mole % in excess of stoichiometric with said monoanhydride;
   (3) about 0.1 to about 1% by weight, based on monoanydride weight plus diepoxide weight, of a difunctional alcohol;
(B) a maleated polybutadiene in a weight ratio with said liquid prepolymer of about 0.8 to 1 to about 1.2 to 1, said maleated polybutadiene comprising the reaction product of
   (1) polybutadiene having a molecular weight of about 3000 to about 4000, having at least 90% 1,2-unsaturation;
   (2) about 0.1 to about 0.15 moles of maleic anhydride per repeating unit of said polybutadiene;
   (3) about 0.3 to about 0.6% by weight, based on total solids, of an oxygen scavenger; and
(C) about 0.25 to about 0.75% by weight, based on total solids, of a tertiary amine catalyst;
(D) about 2 to about 4% by weight, based on total solids, of a peroxide free radical initiator that has a half life of at least 30 minutes at 135° C. and
(E) about 35 to about 50% by weight, based on total solids, of a solvent selected from the group consisting of aromatic hydrocarbons, aliphatic ketones, and mixtures thereof.

16. A prepreg comprising a sheet of porous material impregnated with a composition according to claim 15, dried and cured to the B-stage.

17. A laminate comprising a stack of prepregs according to claim 16, bonded together and cured to the C-stage.

18. A method of making a resin composition comprising:
(A) preparing a liquid prepolymer by heating at about 80° to about 120° C. for about 4 to about 8 hours, a mixture that comprises:
   (1) a monoanhydride;
   (2) a cycloaliphatic epoxy in an amount from about stoichiometric with said monoanydride to about 20 mole % in excess of stoichiometric; and
   (3) about 0.1 to about 1% by weight, based on said monoanhydride weight plus said cycloaliphatic epoxy weight, of an alcohol;
(B) mixing, in a weight ratio of about 2 to 1 to about 1 to 2, said liquid prepolymer with maleated polybutadiene that comprises the reaction product of
   (a) polybutadiene having a molecular weight of about 1000 to about 5000, and having at least 80% 1,2-unsaturation;
   (b) about 0.05 to about 0.2 moles of maleic anhydride per repeating unit of said polybutadiene; and
   (c) about 0.01 to about 1.0% by weight, based on maleated polybutadiene weight, of an oxygen scavenger; and
   (c) about 0.1 to about 3% by weight, based on total solids, of a tertiary amine catalyst;
   (d) about 1 to about 6% by weight, based on total resin solids, of a free radical initiator that has a half life of at least 30 minutes at 135° C.; and
   (e) about 30 to about 60% by weight of a solvent, based on total composition weight.

19. A method according to claim 18 wherein said maleated polybutadiene is prepared by heating at about 160° to about 190° C. for about 3 to about 6 hours.

20. A method according to claim 18 including the additional last steps of
   (1) impregnating a porous sheet with said composition;
   (2) evaporating the solvent from said impregnated sheet; and
   (3) heating said sheet at about 125° to about 160° C. for about 3 to about 10 minutes to cure said composition to the B-stage and form a prepreg.

21. A method according to claim 20 including the additional last steps of
   (1) forming a stack which comprises at least two of said prepregs;
   (2) heating said stack at about 180° to about 220° C. for about 40 minutes to about 2 hours under a pressure of about 500 to about 1500 psi. to form a laminate.

22. A prepreg made according to the method of claim 20.

23. A laminate made according to the method of claim 21.

* * * * *